United States Patent
Zhang

(10) Patent No.: US 10,797,171 B2
(45) Date of Patent: Oct. 6, 2020

(54) LATERALLY DIFFUSED MOSFET WITH LOCOS DOT

(71) Applicant: GLOBALFOUNDRIES Singapore Pte. Ltd., Singapore (SG)

(72) Inventor: Guowei Zhang, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 16/012,358

(22) Filed: Jun. 19, 2018

(65) Prior Publication Data

US 2019/0386138 A1 Dec. 19, 2019

(51) Int. Cl.
| | | |
|---|---|---|
| *H01L 29/78* | (2006.01) | |
| *H01L 29/423* | (2006.01) | |
| *H01L 27/092* | (2006.01) | |
| *H01L 29/40* | (2006.01) | |
| *H01L 29/66* | (2006.01) | |

(52) U.S. Cl.
CPC ........ *H01L 29/7835* (2013.01); *H01L 27/092* (2013.01); *H01L 29/402* (2013.01); *H01L 29/42368* (2013.01); *H01L 29/42376* (2013.01); *H01L 29/66659* (2013.01); *H01L 29/7834* (2013.01)

(58) Field of Classification Search
CPC ........... H01L 29/42368; H01L 29/1095; H01L 29/7816; H01L 29/7813; H01L 29/7835
See application file for complete search history.

(56) References Cited

U.S. PATENT DOCUMENTS

| | | | | |
|---|---|---|---|---|
| 6,222,235 B1* | 4/2001 | Kojima | ............... | H01L 27/0266 257/355 |
| 7,851,871 B2* | 12/2010 | Harada | ............. | H01L 21/82346 257/369 |
| 8,174,071 B2 | 5/2012 | Tien et al. | | |
| 2001/0025987 A1 | 10/2001 | Akaishi et al. | | |
| 2009/0032870 A1 | 2/2009 | Iida | | |
| 2009/0256212 A1* | 10/2009 | Denison | .............. | H01L 29/0653 257/408 |
| 2010/0006935 A1* | 1/2010 | Huang | ................ | H01L 29/7835 257/341 |
| 2010/0102386 A1* | 4/2010 | You | ..................... | H01L 29/0878 257/336 |
| 2010/0244151 A1 | 9/2010 | French et al. | | |
| 2017/0018612 A1* | 1/2017 | Ito | ....................... | H01L 29/0882 |

FOREIGN PATENT DOCUMENTS

TW          201101494         1/2011

OTHER PUBLICATIONS

Taiwanese Office Action and Search Report in related TW Application No. 108117119 dated Dec. 12, 2019, 8 pages.
Taiwanese Office Action and Search Report in related TW Application No. 108117119 dated Jun. 18, 2020, 8 pages.

* cited by examiner

*Primary Examiner* — Zandra V Smith
*Assistant Examiner* — John M Parker
(74) *Attorney, Agent, or Firm* — Francois Pagette; Andrew M. Calderon; Roberts Calderon Safran & Cole, P.C.

(57) ABSTRACT

The present disclosure relates to semiconductor structures and, more particularly, to a laterally diffused MOSFET (LDMOS) and methods of manufacture. The structure includes: a gate structure having a drain region and a source region; and an oxidation extending from the gate structure to the drain region of the gate structure, the oxidation comprising a thinner oxide portion and a thicker oxide portion.

20 Claims, 3 Drawing Sheets

LATERALLY DIFFUSED MOSFET WITH LOCOS DOT

FIELD OF THE INVENTION

The present disclosure relates to semiconductor structures and, more particularly, to a laterally diffused MOSFET (LDMOS) device and methods of manufacture.

BACKGROUND

A Laterally Diffused MOSFET (LDMOS) is an asymmetric power MOSFET designed for low on-resistance and high blocking voltage. These features are obtained by creating a diffused p-type channel region in a low-doped, n-type drain region. LDMOS devices can be fabricated with different voltage requirements such as, e.g., 10V, 12V, 16V 20V, 24V, 30V, etc. The different voltage devices are fabricated using the same platform and same processes including the fabrication of the drift region.

Typically, in conventional LDMOS devices, the oxide between the gate and drain is very thick. This thick oxide between the gate and drain is used to prevent the gate to drain breakdown for the higher voltage devices. However, the thick oxide for lower voltage LDMOS devices can increase the current path and provide higher conduction path resistance. This, in turn, results in higher resistance of the LDMOS device in the lower voltage applications.

SUMMARY

In an aspect of the disclosure, a structure comprises: a gate structure having a drain region and a source region; and an oxidation extending from the gate structure to the drain region of the gate structure, the oxidation comprising a thinner oxide portion and a thicker oxide portion.

In an aspect of the disclosure, a structure comprises: a gate structure having a gate oxide material; a source region adjacent to the gate structure; a drain positioned away from the gate structure, over a drift region; and an oxidation extending from the gate structure to the drain region in the drift region, the oxidation comprising alternating thinner and thicker portions.

In an aspect of the disclosure, a method comprises: forming a gate structure having a gate oxide material; forming a source region adjacent to the gate structure; forming a drain positioned away from the gate structure, over a drift region; and forming an oxidation extending from the gate structure to the drain region in the drift region, the oxidation comprising alternating thinner and thicker portions.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a laterally diffused MOSFET (LDMOS) device and methods of manufacture. More specifically, the present disclosure uses a varied oxide thickness between a gate and drain region using LOCOS (Local Oxidation Of Silicon), which can be implemented in both low and high voltage applications. Advantageously, the LOCOS effectively optimizes the lower voltage LDMOS device in the same process that can be used for a higher voltage LDMOS device.

In embodiments, the structure described herein includes a low voltage LDMOS device with a thinner oxide region in a drift region (at a bird's beak). In providing a thinner oxide region, it is now possible to provide a high current, low Rdson LDMOS design. In addition, it is also possible to provide a smaller pitch, low Rdson LDMOS design. The LDMOS also include a thicker oxide region for higher voltage applications. Accordingly, the thinner oxide region in the drive region provides improvement in on-state performance, with no degradation in off-state performance.

The LDMOS device of the present disclosure can be manufactured in a number of ways using a number of different tools. In general, though, the methodologies and tools are used to form structures with dimensions in the micrometer and nanometer scale. The methodologies, i.e., technologies, employed to manufacture the LDMOS device of the present disclosure have been adopted from integrated circuit (IC) technology. For example, the LDMOS device is built on wafers and are realized in films of material patterned by photolithographic processes on the top of a wafer. In particular, the fabrication of the LDMOS device uses three basic building blocks: (i) deposition of thin films of material on a substrate, (ii) applying a patterned mask on top of the films by photolithographic imaging, and (iii) etching the films selectively to the mask.

Figure 1:
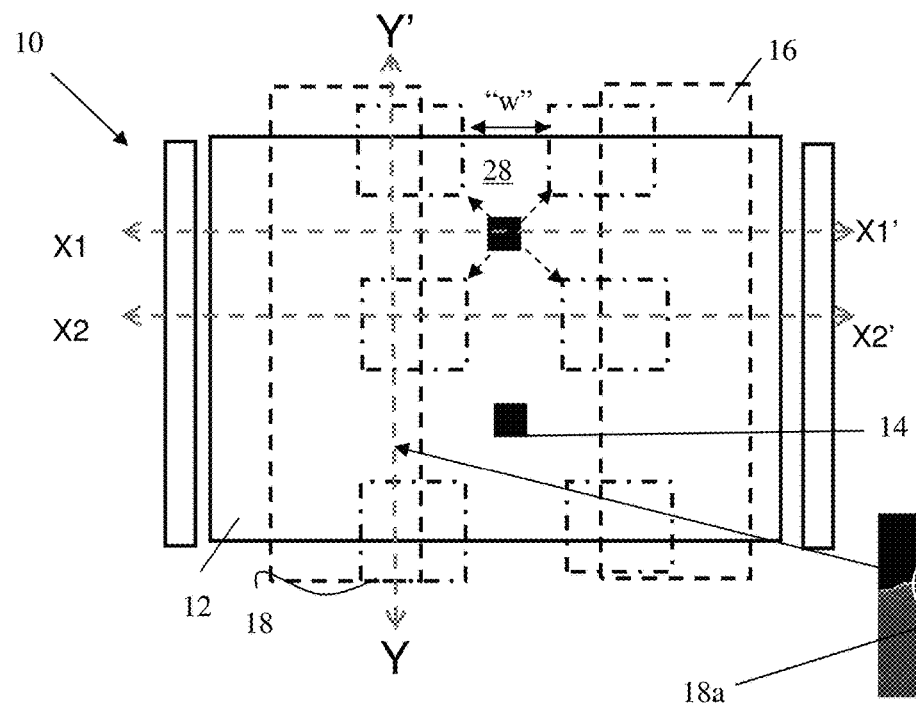
FIG. 1 shows a top view of an LDMOS device in accordance with aspects of the present disclosure.

FIG. 1 shows a top view of an LDMOS device in accordance with aspects of the present disclosure. In particular, the LDMOS device 10 includes an active region 12 with a plurality of contacts 14 between gate structures 16. In embodiments, the gate structures 16 are separated by a drain region 28 having a width "w". A plurality of oxide regions 18 are partially under the gate structures 16 and extend to the drain region 28. In embodiments, the oxide regions 18 are provided in a drift region, offset from the contacts 14.

The oxide regions 18 can be a LOCOS (Local Oxidation Of Silicon) with a bird's beak portion, e.g., thinner region 18a as shown in the inset of FIG. 1. As the LOCOS bird beak is thinner along a width direction of the device than the LOCOS center, a thinner oxide region in the drift region can be fabricated compared to a conventional LDMOS device with a full LOCOS case (i.e., uniform or continual thick oxide). This thinner LOCOS bird's beak will be of benefit for lower Rdson applications. In addition, as the contact 14 is sitting in the diagonal direction of the LOCOS opening, the LOCOS to LOCOS space can also be shrunk compared to a conventional LDMOS device, which also can shrink the device pitch for lower Rdson. In addition, the thicker portion of the LOCOS oxide between the gate structure 16 and drain region can be used to sustain the lower voltage bias on the drain.

Figure 2A:
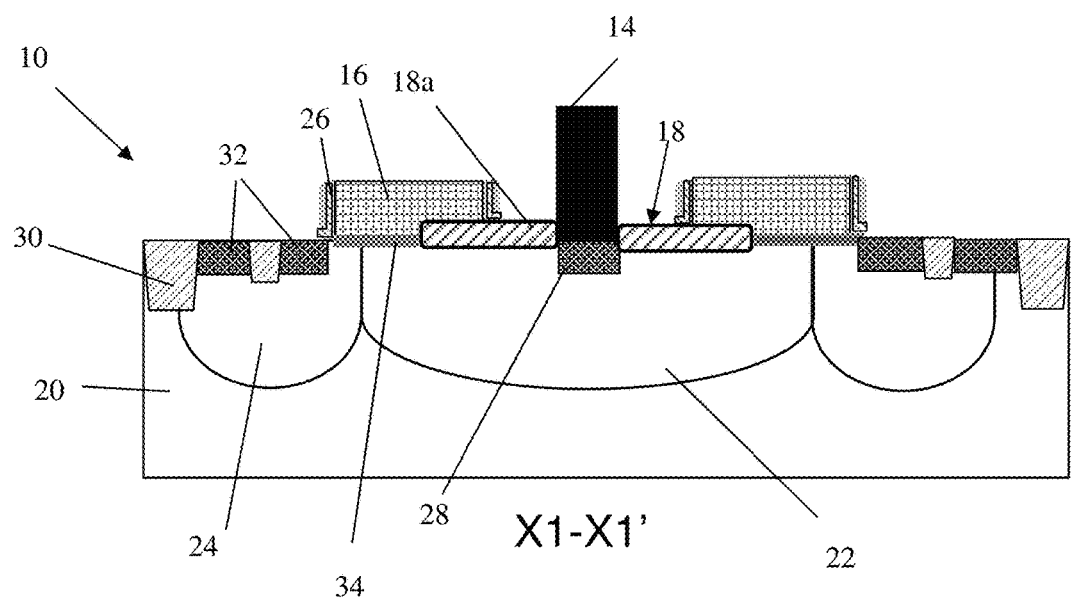
FIG. 2A shows a cross-sectional view of the LDMOS device along line X1-X1' of FIG. 1 in accordance with aspects of the present disclosure.

FIG. 2A shows a cross-sectional view of the LDMOS device 10 of FIG. 1 along line X1-X1' in accordance with aspects of the present disclosure. As shown in FIG. 2A, the LDMOS device 10 includes a p-substrate 20. In embodiments, the p-substrate 20 may be composed of any suitable semiconductor material including, but not limited to, Si, SiGe, SiGeC, SiC, GaAs, InAs, InP, and other III/V or II/VI compound semiconductors. The p-substrate 20 includes a drift region 22 and p-wells 24. In embodiments, the drift region 22 is an N type drift region, as an example, extending under a gate 16 and drain region 28. The drift region 22 and p-wells 24 can be formed by conventional ion implantation or doping process such that no further explanation is required for an understanding of the present disclosure.

Prior to forming a contact 14 to the drain region 28, a silicide process can be performed. As should be understood by those of skill in the art, the silicide process begins with deposition of a thin transition metal layer, e.g., nickel, cobalt or titanium, over fully formed and patterned semiconductor devices (e.g., doped or ion implanted source and drain regions and respective devices). After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts in the active regions of the device. It should be understood by those of skill in the art that silicide contacts will not be required on the devices, when a gate structure is composed of a metal material.

As shown in FIG. 2A, the contact 14 is in direct electrical contact with the drain region 28 and adjacent to the thinner oxide region 18a (along a width of a device) that extends over the drift region 22 and partially underneath the gate structure 16. In embodiments, the contact 14 can be any conductive material such as, e.g., copper, formed by conventional lithography, etching and deposition processes as described herein.

For example, a resist formed over an insulator material (not show) is exposed to energy (light) to form a pattern (opening). An etching process with a selective chemistry, e.g., reactive ion etching (RIE), will be used to form one or more trenches in the insulator material, aligned with the drain region 28. A conductive material (e.g., copper) can then be deposited by any conventional deposition processes, e.g., chemical vapor deposition (CVD) processes within the trench or trenches to form the contact or contacts. After the contact is formed, the resist is removed by a conventional oxygen ashing process or other known stripants.

Still referring to FIG. 2A, shallow trench isolation structures 30 and N+ and P+ diffusions 32 are formed in the p-wells 24. In embodiments, the N+ diffusions can be source regions for the gate structures 16, formed by conventional doping or ion implantation processes. The shallow trench isolation structures 30 can be formed by conventional lithography, etching and deposition methods as already described herein and which is known to those of skill in the art (e.g., prior to gate and contact formation). In embodiments, the shallow trench isolation structures 30 can be formed prior to or after the formation of the N+ and P+ diffusions 32. For example, an etching process with a selective chemistry, e.g., RIE, will be used to form one or more trenches in the substrate 20 through the openings of the resist. Following the resist removal, an insulator material (e.g., oxide) can be deposited within the trenches by any conventional deposition processes, e.g., CVD processes. Any residual insulator material on the surface of the substrate 20 can be removed by conventional chemical mechanical polishing (CMP) processes.

The gate structure 16 can be composed of poly material which is patterned using conventional lithography and etching processes. In embodiments, the gate structure 16 includes sidewall structures 26 and a gate dielectric material 34. The sidewalls can be a nitride or other low-k material as examples. The gate dielectric material 34 can be any gate dielectric material including an oxide material or a high-k gate dielectric material. In embodiments, the high-k dielectric gate material 30 can be a hafnium based dielectric, as an example. In further embodiments, examples of such high-k dielectrics include, but are not limited: $Al_2O_3$, $Ta_2O_3$, $TiO_2$, $La_2O_3$, $SrTiO_3$, $LaA_1O_3$, $ZrO_2$, $Y_2O_3$, $Gd_2O_3$, and combinations including multilayers thereof.

Figure 2B:
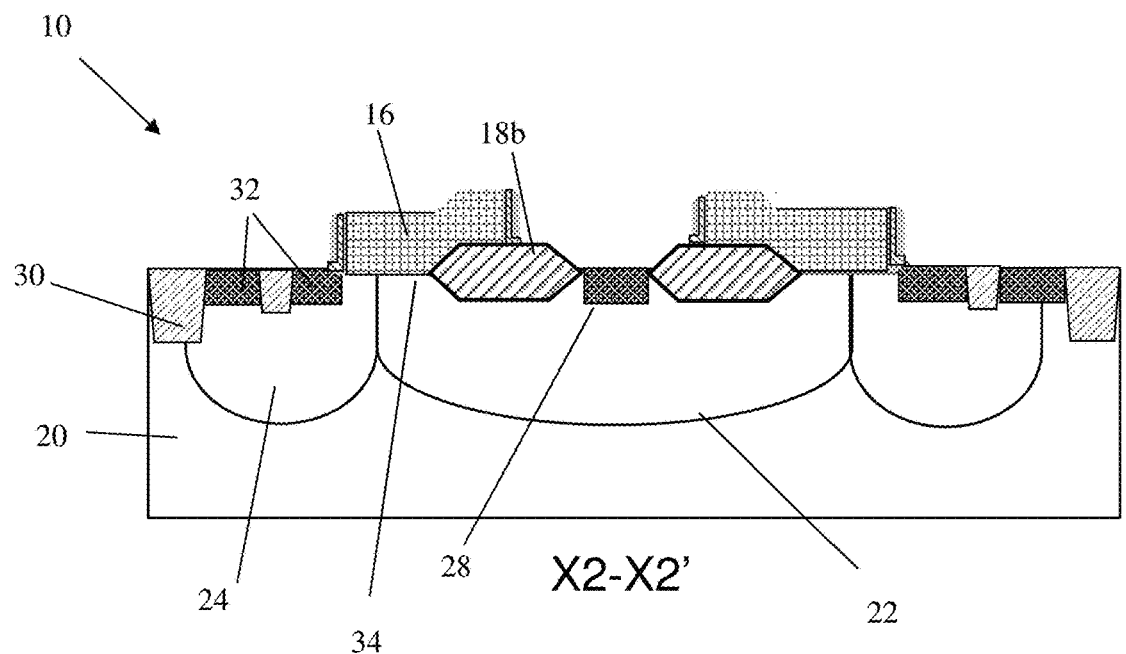
FIG. 2B shows a cross-sectional view of the LDMOS device along line X2-X2' of FIG. 1 in accordance with aspects of the present disclosure.

Referring to FIGS. 2A and 2B, in the drift region 22, the oxide material 18 extends from underneath the gate structure 16 to the drain region 28. More specifically, the oxide material 18 is partially under the gate structure 16, adjacent to the gate dielectric material 34 and extends to and contacts the drain region 28. In embodiments, the oxide material 18 is LOCOS (Local Oxidation Of Silicon) with a bird's beak feature 18a (e.g., thinner region). For example, in embodiments, the oxide material 18 includes a thinner portion (bird's beak along a width of the device) 18a as shown in FIGS. 1 and 2A and a continually thicker portion (center portion along a width of the device) 18b as shown in the FIG. 2B. The thicker region 18b is offset from the contact 14, as shown in FIGS. 1 and 2B. In embodiments, the thinner oxide region 18a shown in FIGS. 1 and 2A can be approximately 10% to 50% of the thickness of the thicker oxide region 18b shown in FIG. 2B.

Figure 2C:
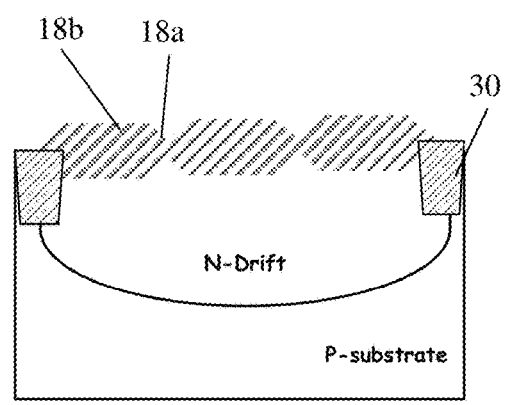
FIG. 2C shows a cross-sectional view of the LDMOS device along line Y-Y' of FIG. 1 in accordance with aspects of the present disclosure.

FIG. 2C shows a cross-sectional view of the LDMOS device of FIG. 1, along line Y-Y'. As shown in FIG. 2C, for example, the oxide regions 18a and 18b vary in thickness along the Y-Y' direction. More specifically, the thinner oxide region 18a and the thicker oxide region 18b alternate with one another. In this way, the LDMOS device 10 described herein can accommodate for better performance of lower voltage applications. For the lower voltage applications, the LDMOS device will exhibit a higher current and lower Rdson.

FIGS. 3A-3D show an oxidation process in accordance with aspects of the present disclosure. More specifically, FIGS. 3A-3D show the process of forming the thick and thin oxide regions of the LOCOS. In embodiments, the thick oxide region 18b and thin oxide region 18a of the LOCOS 18 are formed prior to the gate formation, with the gate structure being formed by a conventional gate formation process such that no further explanation is required herein, e.g., gate oxide growth, poly patterning, with spacer formation and source/drain implant processes. In embodiments, the shallow trench isolation regions 30 can be formed prior to the well regions 22, 24 as already discussed herein.

Figure 3A:
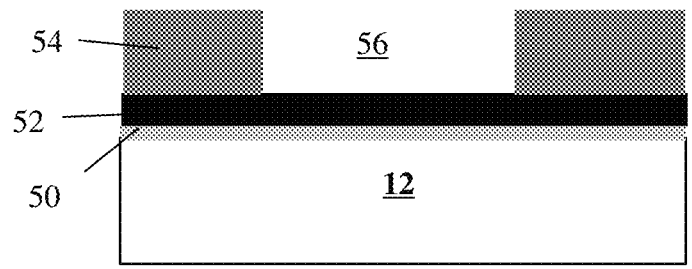
FIGS. 3A-3D show an oxidation process in accordance with aspects of the present disclosure.

Referring to FIG. 3A, a masking material, e.g., $SiO_2$ material 50 and SiN material 52, is deposited over the substrate 20. In embodiments, the $SiO_2$ material 50 and SiN material 52 can be deposited by any conventional deposition processes, e.g., CVD. Following the deposition process, a photoresist 54 is deposited on the SiN material 52, which is exposed to energy to form an opening 56 in an active area of the chip.

Figure 3B:
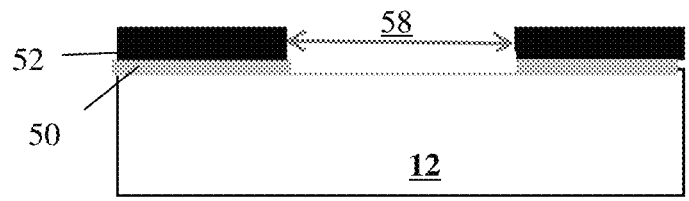

In FIG. 3B, portions of the SiO$_2$ material 50 and SiN material 52 are removed to form an opening 58. In embodiments, the SiO$_2$ material 50 and SiN material 52 can be removed by a dry etching process to form the opening 58. The resist is removed by, e.g., oxygen ashing or other conventional stripping process.

Figure 3C:
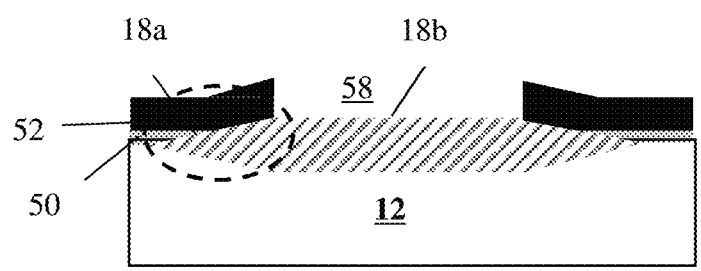

In FIG. 3C, an oxidation of the substrate 20 is performed, ideally through the opening 58. In embodiments, the oxygen will diffuse laterally and oxidize the substrate 20 under the SiN material 52. As shown in FIG. 3C, the oxidation under the SiN material 52 will result in the thinner oxidation region 18a, e.g., "bird beak".

Figure 3D:
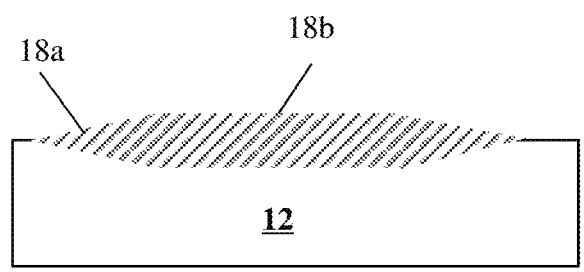

In FIG. 3D, the remaining SiO$_2$ material 50 and SiN material 52 are removed by a dry etch process as already described herein. The gate formation process then continues from this point.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
    a gate structure having a drain region and a source region; and
    an oxidation extending from the gate structure to the drain region of the gate structure, the oxidation comprising a thinner oxide portion and a thicker oxide portion,
    wherein the thinner oxide portion is aligned with a contact positioned between two adjacent gate structures.

2. The structure of claim 1, wherein the thick and thinner oxide portion alternate along the device width direction, the thinner oxide portion is for lower voltage laterally diffused MOSFET (LDMOS) applications, and the thicker oxide portion is continual along the device width direction for higher voltage LDMOS applications.

3. The structure of claim 1, wherein the thinner oxide portion is over a drift region in a semiconductor material.

4. The structure of claim 1, wherein the thinner oxide portion is a bird's beak.

5. The structure of claim 1, wherein the thinner oxide portion extends along a length of the gate structure.

6. The structure of claim 1, further comprising a contact that is positioned at a diagonal to the oxidation.

7. The structure of claim 6, wherein the oxidation spans underneath the gate structure and extends to the drain region of the gate structure.

8. The structure of claim 6, wherein the thicker oxide portion is offset from the contact.

9. The structure of claim 1, wherein the gate structure includes sidewall structures and a gate dielectric material, wherein the sidewall structures are located over the source region and the thicker portion.

10. The structure of claim 9, further comprising a drift region between the gate structure and the drain region, and the oxidation extends from partially under the gate structure, adjacent to gate dielectric material, and extends to and contacts the drain region.

11. The structure of claim 10, wherein the thicker portion is offset from the contact between the two adjacent gate structures.

12. The structure of claim 11, wherein the thinner portion and the thicker portion are multiple thinner portions and thicker portions which alternate with one another.

13. The structure of claim 1, wherein the thinner portion and the thicker portion are multiple thinner portions and thicker portions which alternate with one another.

14. The structure of claim 1, wherein the source region is composed of N+ and P+ diffusions and a shallow trench isolation structure separates the N+ and P+ diffusions, the N+ and P+ diffusions and the shallow trench isolation structure are formed in a p-well adjacent to the gate structure.

15. A structure comprising:
    a gate structure having a gate oxide material;
    a source region adjacent to the gate structure;
    a drain positioned away from the gate structure, over a drift region; and
    an oxidation extending from the gate structure to the drain region in the drift region, the oxidation comprising alternating thinner and thicker portions,
    wherein the thinner portion is aligned with a contact positioned between two adjacent gate structures.

16. The structure of claim 15, wherein the thicker oxide portion and thinner oxide portion alternate along a width direction of the device, the thinner oxide portion is for lower voltage laterally diffused MOSFET (LDMOS) applications and the thicker oxide is continual along the device width direction for higher voltage LDMOS applications.

17. The structure of claim 15, wherein the thinner oxide portion is a bird's beak extending along a length of the gate structure.

18. The structure of claim 15, further comprising a contact that is positioned at a diagonal to the oxidation.

19. The structure of claim 15, wherein the oxidation spans partially underneath the gate structure and extends to the drain region.

20. A structure comprising:
    a gate structure having a gate oxide material;
    a source region adjacent to the gate structure;
    a drain positioned away from the gate structure, over a drift region; and
    an oxidation extending from the gate structure to the drain region in the drift region, the oxidation comprising alternating thinner and thicker portions,
    wherein the thicker portion is offset from a contact positioned between two adjacent gate structures.

* * * * *